United States Patent
Singhal et al.

(10) Patent No.: US 11,031,244 B2
(45) Date of Patent: Jun. 8, 2021

(54) MODIFICATION OF $SnO_2$ SURFACE FOR EUV LITHOGRAPHY

(71) Applicant: Lam Research Corporation, Fremont, CA (US)

(72) Inventors: Akhil Singhal, Beaverton, OR (US); Nader Shamma, Cupertino, CA (US); Dustin Zachary Austin, Corvallis, OR (US)

(73) Assignee: Lam Research Corporation, Fremont, CA (US)

( * ) Notice: Subject to any disclaimer, the term of this patent is extended or adjusted under 35 U.S.C. 154(b) by 164 days.

(21) Appl. No.: 16/103,849

(22) Filed: Aug. 14, 2018

(65) Prior Publication Data

US 2020/0058492 A1 Feb. 20, 2020

(51) Int. Cl.
| | |
|---|---|
| *H01L 21/02* | (2006.01) |
| *H01L 21/027* | (2006.01) |
| *G03F 7/20* | (2006.01) |
| *H01L 21/033* | (2006.01) |
| *G03F 7/16* | (2006.01) |

(52) U.S. Cl.
CPC .......... *H01L 21/0274* (2013.01); *G03F 7/162* (2013.01); *G03F 7/2004* (2013.01); *H01L 21/02175* (2013.01); *H01L 21/0332* (2013.01); *H01L 21/0337* (2013.01)

(58) Field of Classification Search
CPC .......... H01L 21/0274; H01L 21/02175; H01L 21/0337; H01L 21/0332; H01L 21/02312; H01L 21/02118; H01L 21/02282; H01L 21/31144; H01L 21/02359; G03F 7/2004; G03F 7/162; G03F 7/165; G03F 7/16
See application file for complete search history.

(56) References Cited

U.S. PATENT DOCUMENTS 3,549,368 A * 12/1970 Deverse .................. H01L 29/00
 430/272.1
5,312,776 A * 5/1994 Murakami ........ H01L 21/02071
 148/279

(Continued)

FOREIGN PATENT DOCUMENTS

JP 2014197628 A 10/2014

OTHER PUBLICATIONS

Notification of Transmittal of the International Search Report and the Written Opinion of the International Searching Authority, PCT/US2019/046243, dated Dec. 2, 2019, 9 pages.

*Primary Examiner* — Khaja Ahmad
*Assistant Examiner* — Pavel G Ivanov
(74) *Attorney, Agent, or Firm* — Penilla IP, APC

(57) ABSTRACT

A method for improving EUV lithographic patterning of $SnO_2$ layers is provided. One method embodiment includes introducing a hydrophobic surface treatment compound into a processing chamber for modifying a surface of an $SnO_2$ layer. The modification increases the hydrophobicity of the $SnO_2$ layer. The method also provides for depositing a photoresist layer on the surface of the $SnO_2$ layer via spin coating. The modification of the surface of the $SnO_2$ layer enhances adhesion of contact between the photoresist and the $SnO_2$ layer during and after spin coating.

19 Claims, 8 Drawing Sheets

(56) References Cited

U.S. PATENT DOCUMENTS

| | | | | |
|---|---|---|---|---|
| 5,401,316 | A | * | 3/1995 | Shiraishi ............. C23C 16/4412 |
| | | | | 118/689 |
| 9,535,332 | B2 | | 1/2017 | Ruoff et al. |
| 9,773,672 | B2 | | 9/2017 | Kim et al. |
| 9,899,219 | B2 | | 2/2018 | Luong et al. |
| 9,996,004 | B2 | | 6/2018 | Smith et al. |
| 2002/0051932 | A1 | * | 5/2002 | Brainard ............... G03F 7/2004 |
| | | | | 430/270.1 |
| 2004/0164679 | A1 | * | 8/2004 | Hibino .................... H01J 11/48 |
| | | | | 313/582 |
| 2010/0316851 | A1 | * | 12/2010 | Hirai ..................... G06F 3/0443 |
| | | | | 428/195.1 |
| 2011/0116992 | A1 | * | 5/2011 | North ....................... C08J 7/123 |
| | | | | 422/503 |
| 2011/0143101 | A1 | * | 6/2011 | Sandhu .................. B82Y 30/00 |
| | | | | 428/195.1 |
| 2013/0100428 | A1 | | 4/2013 | Ruoff et al. |
| 2016/0233083 | A1 | | 8/2016 | Kim et al. |
| 2017/0004977 | A1 | * | 1/2017 | Hu .................... H01L 21/31127 |
| 2017/0102612 | A1 | * | 4/2017 | Meyers ................. G03F 7/0042 |
| 2017/0146909 | A1 | | 5/2017 | Smith et al. |
| 2017/0243744 | A1 | | 8/2017 | Luong et al. |
| 2018/0233362 | A1 | * | 8/2018 | Glodde ............... H01L 21/0332 |

\* cited by examiner

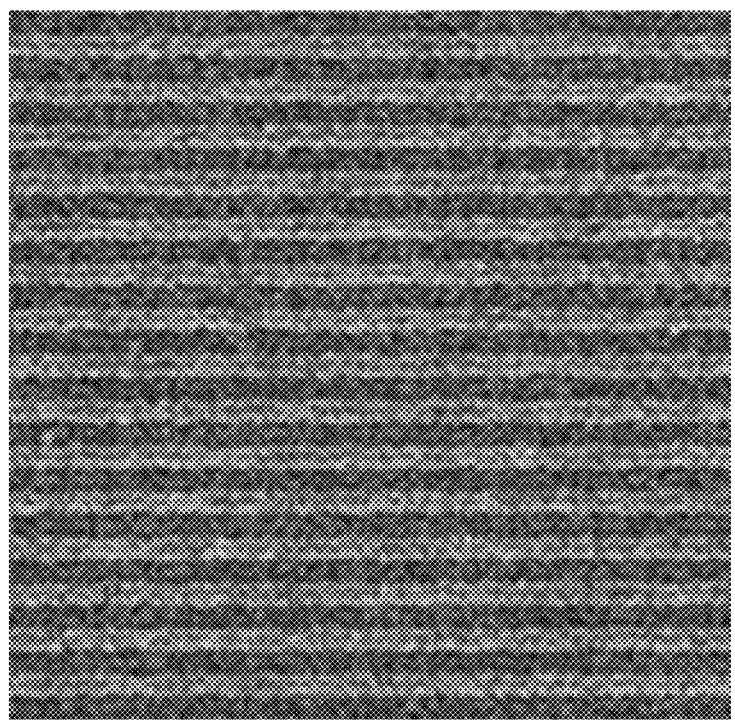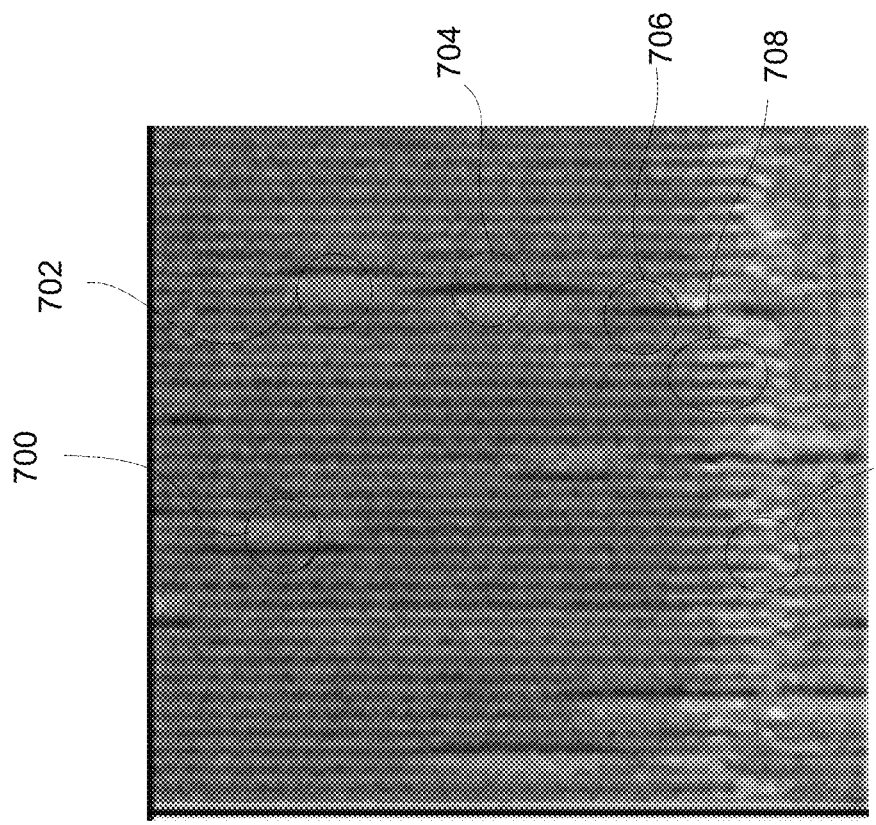
Fig. 7B
Fig. 7A

MODIFICATION OF SNO₂ SURFACE FOR EUV LITHOGRAPHY

TECHNICAL FIELD

The present embodiments relate to semiconductor substrate processing methods and equipment tools, and more particularly, methods and systems for modifying the surface chemistry of $SnO_2$ to enhance photoresist pattern stability and process windows during extreme ultraviolet (EUV) lithography.

BACKGROUND

Production of semiconductor electronic devices such as integrated circuits (ICs) often involve lithographic processes for transferring a circuit pattern from a mask onto a substrate. The demand for higher processing speeds and functionalities of devices require that features within the IC be smaller and smaller to meet critical dimensions (CDs). Currently, extreme ultraviolet (EUV) lithography having radiation wavelengths of about 13.5 nm is being developed for high volume manufacturing (HVM) to achieve the needs of the required critical dimension targets for next-generation technology nodes.

A challenge in developing EUV lithography at wavelengths of 13.5 nm or lower for HVM is improving line width variation (LWV) and line edge roughness (LER) to prevent pattern collapse and to achieve critical dimensions. One of the major areas in need of improvement to achieve critical dimensions for EUV lithography HVM are photoresist (PR) design and processes, which are often the cause of LWR and LER. Methods that modify the PR application process to prevent pattern collapse require higher doses of EUV light, which increases costs and reduces throughput. As a result, improved methods of PR application are desired with which critical dimensions may be achieved without requiring larger doses of EUV radiation.

It is in this context that embodiments arise.

SUMMARY

The present embodiments relate to an improved process of enabling application photoresist directly onto $SnO_2$ layers for enhanced secondary electron harvesting from the $SnO_2$ layers and improvements to pattern transfer resolution onto the $SnO_2$ layers. Embodiments of the present disclosure provide methods and systems for modifying the surface chemistry of the $SnO_2$ layer to be more hydrophobic to enhance photoresist adhesion and allow direct application of photoresist onto the $SnO_2$ layer without an intervening layer of adhesive material. It should be appreciated that the present embodiments can be implemented in numerous ways, such as a method, an apparatus, a system, a device, or a computer program on a computer readable medium. Several embodiments are described below.

In one embodiment, a method includes introducing a hydrophobic surface treatment compound into a processing chamber. The processing chamber contains a substrate within an $SnO_2$ layer for processing. The hydrophobic surface treatment compound forms a modification to the surface of the $SnO_2$ layer that increases hydrophobicity of the surface. The method also provides for depositing a photoresist layer on the surface of the $SnO_2$ layer via spin coating. The modification of the surface of the $SnO_2$ layer enhances adhesion of contact between the photoresist and the $SnO_2$ layer during spin coating.

In one embodiment, a method includes an operation of depositing a $SnO_x$ layer on a substrate in a processing chamber where a surface of the $SnO_x$ layer is hydrophilic. The method includes an operation for reacting the surface of the $SnO_x$ layer with a hydrophobic surface treatment compound such that the surface becomes less hydrophilic. The method also provides for spin coating a photoresist on the $SnO_x$ layer, the surface of the $SnO_x$ layer as reacted with the hydrophobic surface treatment compound increases to be less hydrophilic increases adhesion of the $SnO_x$ layer to the photoresist such that there is direct contact between the photoresist and the $SnO_x$ layer.

In one embodiment, a substrate is provided. The substrate includes an $SnO_x$ layer having a chemically modified surface, the chemically modified surface includes a monolayer of hydrophobic surface treatment compound. The substrate also includes a photoresist layer contacting the chemically modified surface of the $SnO_x$ layer.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIGS. 7A and 7B show scanning electron microscope (SEM) images of etched $SnO_2$ layers with line patterns of roughly 18 nm pitches, according to one embodiment.

DETAILED DESCRIPTION

Figure 1:
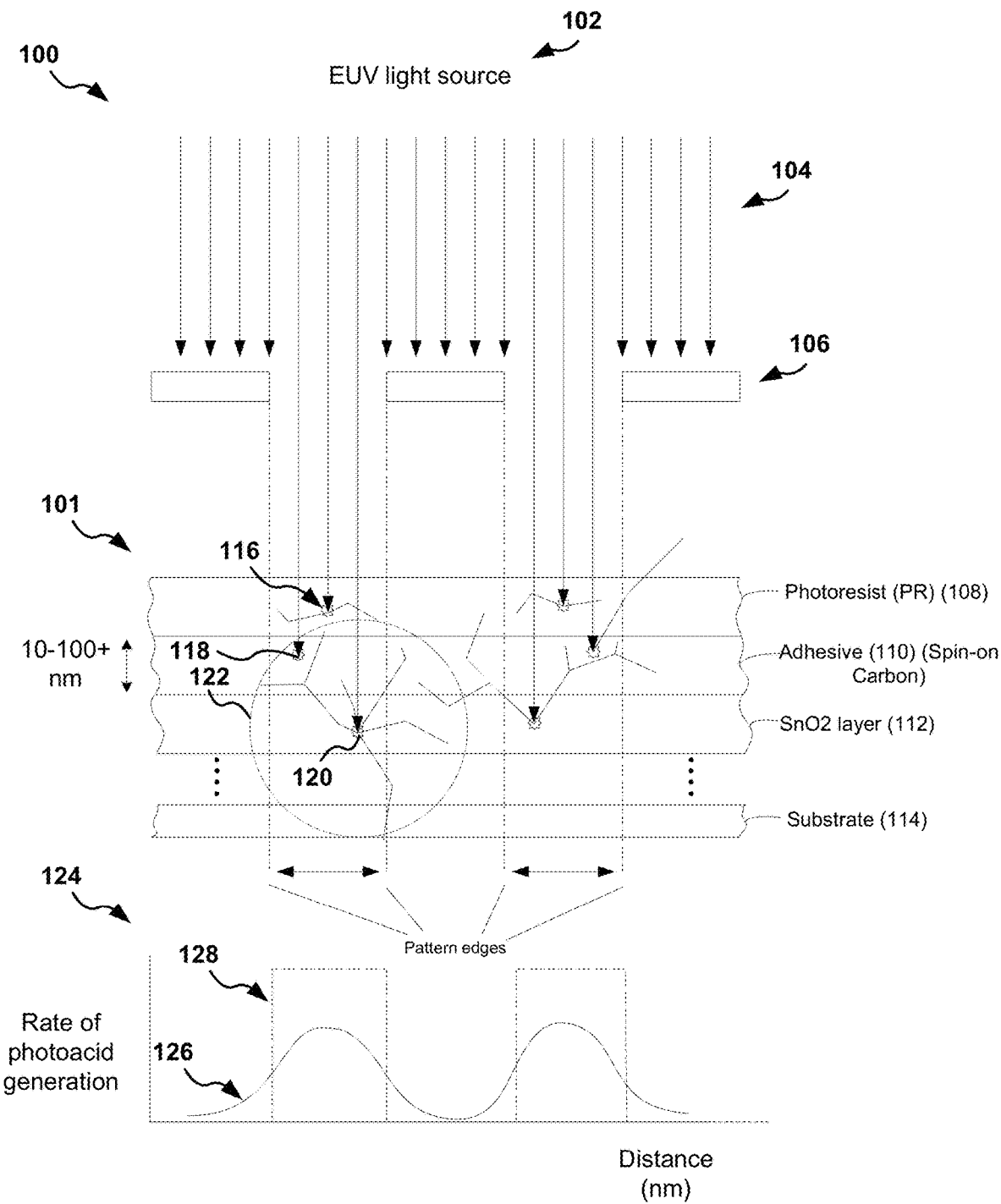
FIG. 1 shows a conceptual diagram of a stack being exposed to EUV radiation through a mask or reticle in a EUV lithography system, wherein the stack includes an intervening layer of adhesive between the photoresist and the $SnO_2$ layer, according to one embodiment.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

$SnO_x$ layers (e.g., where x is between 1-8 or higher) are contemplated to be used in substrate processing for a variety of applications. It is to be understood that the present disclosure applies to deposited layers of $SnO_xH_y$, where x=1-8 or more and where y varies depending upon the deposition process. Typically, a $SnO_x$ film may have an oxygen to tin ratio of approximately 2:1, depending upon various deposition parameters. Thus, much of the following detail description will use $SnO_2$ as a non-limiting exemplary chemical structure of tin oxide films and layers. However, this is done for illustrative purposes and is not intended to restrict the advantages of the present disclosure to $SnO_2$. One of skill in the relevant art will readily recognize that the advantages presented and described here will apply many stoichiometries and oxidation states of tin oxide, including $SnO$, $SnO_2$, $SnO_3$, $SnO_4$, $SnO_6$, $SnO_8$, and so on.

In some embodiments, $SnO_2$ layers are contemplated to be used as an extreme ultraviolet (EUV) hard mask (HM), as a spacer and mandrel core for patterning, as a gapfill oxide, as a hard mask, and as etch stop layers. $SnO_2$ films may be deposited on a substrate in a number of ways. In one chemical vapor deposition (CVD) process, the substrate is exposed to vapor phase reactant containing tin (e.g., $Sn(CH_3)_4$, $SnCl_4$, Sn, etc.) in the presence of atomic oxygen to form a layer of $SnO_2$ on the substrate. Additionally, $SnO_2$ films may be deposited via atomic layer deposition (ALD).

One way in which $SnO_2$ may be patterned is through EUV lithography. A photoresist is applied on top of the $SnO_2$ layer for exposure to EUV radiation. During EUV radiation, a mask or reticle is used to transfer a desired pattern onto the photoresist. EUV light in the 124 nm to 10 nm range (corresponding to photonic energies of 10 eV to 124 eV) is used to irradiate the photoresist as well as the $SnO_2$ layer beneath it. In some embodiments, beyond ultraviolet light (BEUVL) may be used, such as wavelengths of down to 5 nm. When an EUV photon is absorbed by a molecule in the photoresist, it may cause photodissociation of a photoacid generator to produce a photoacid, which causes further reactions to make the photoresist soluble in a developer solution (usually an alkaline solution).

Another mechanism in which photoacid is generated is through photoelectron generation through absorption of an EUV photon. Photoelectrons (e.g., primary electrons) generated in this manner scatter randomly within the photoresist polymer matrix or the $SnO_2$ crystalline matrix. In the process of scattering and losing energy, the photoelectrons generally ionize several molecules within the photoresist or the $SnO_2$. These ionization events caused by a photoelectron generate secondary electrons, which lead to photoacid generation. The polymers in the photoresist are chemically sensitive to acid and regions in the photoresist where photoacid is generated become soluble and removable by a developer solution. Secondary electron generation has been found to be the primary source of photoacid generation.

$SnO_2$ is a strong absorber of EUV light. When an EUV photon is absorbed by the $SnO_2$, a photoelectron is produced. The photoelectrons have energies between about 50 eV or lower to about 100 eV or higher and scatter in what has been observed to be random directions. As a result, some of these photoelectrons will propagate from the $SnO_2$ layer into the photoresist layer, generating secondary electrons through ionization events along the way. For any given photoelectron, several secondary electrons may be generated, which also propagate in stochastic fashion. As the secondary electrons propagate through from the $SnO_2$ layer and into the photoresist, it causes ionization events in photoacid generators (PAGs). The resulting acid attacks acid-labile protecting groups (e.g., that induce insolubility of the photoresist) and typically replaces the protecting group with a hydroxide group that is soluble in an alkaline solution (e.g., a developer).

Both photoelectrons and secondary electrons have a finite mean free path that depend on their energies. For example, each ionization event reduces its energy until it has an energy that is low enough to be absorbed without causing an additional ionization event. In certain estimates, the mean free path of secondary electrons having energies between 10 eV and 100 eV is within a range of 20 nm to 1 nm in photoresist. As a result, the quantum yield or quantum efficiency (e.g., the number of acid generation events per unit photon) is a function of the distance of separation between the $SnO_2$ absorption event and the photoresist layer. It is therefore desirable to minimize the distance between the $SnO_2$ and the photoresist layer to increase the quantum yield and decrease the EUV radiation dose required to transfer a desired pattern onto the photoresist. Decreasing the EUV dose lowers exposure times, reduces cost, and speeds up processing times. However, there are challenges associated with minimizing the distance between the photoresist and the $SnO_2$ layer, for example, by applying photoresist directly to the $SnO_2$ layer.

$SnO_2$ surfaces are hydrophilic due to the $SnO_2$ bond polarities and ability to participate in polar-polar interactions. In some embodiments, $SnO_2$ surfaces found to be associated with a water contact angle (WCA) of about 1°-30°. A lower WCA (e.g., below 90°) is associated with hydrophilicity whereas a higher WCA (e.g., above 90°) is associated with hydrophobicity. Empirical measurements of WCA will depend on a variety of factors, including the smoothness or roughness of the surface, the topology of the surface, lattice properties, oxygen vacancies in the surface lattice, the thickness of the layer, impurities and/or contamination in the layer, among other factors.

On the other hand, photoresist that is used in EUV lithography is generally characterized by hydrophobicity due to the presence of non-polar groups and polymeric organic material. Hydrophobic materials tend not to adhere to hydrophilic surfaces because interactions between the hydrophobic molecules and hydrophilic molecules are less thermodynamically favorable than hydrophobic-hydrophobic interactions of the hydrophobic material with itself. As a result, when hydrophobic photoresist is applied directly onto the hydrophilic $SnO_2$ surface, it may not adhere uniformly to the surface when spun on and may bead up or form irregularities in thickness across the $SnO_2$ surface. As a result of these irregularities and nonuniformities in the photoresist layer, there may be a non-uniform quantum yield across the photoresist layer as well as the $SnO_2$ layer. This leads to irregular and unintended deviations in photoacid generation in the photoresist. Applying photoresist directly onto the $SnO_2$ layer leads to increases in line edge roughness and line width variation to an extent that there is pattern collapse after subsequent etching of the $SnO_2$ layer.

To counteract the poor adhesion of photoresist to $SnO_2$ surfaces, one or more intervening layers (e.g., spin-on-carbon) may be placed between the photoresist and the $SnO_2$. The intervening layer has greater adhesion to both photoresist and the $SnO_2$ than the photoresist does to $SnO_2$. As a result, photoresist may be applied to the intervening layer without beading up or forming or other irregularities in thickness and/or topology. Subsequent etching of the $SnO_2$ may be accomplished without the extent of pattern collapse observed when photoresist is applied to the $SnO_2$ layer with an intervening layer. However, higher EUV radiation doses are required to transfer a pattern defined by the mask or reticle onto the photoresist because the intervening layer reduces the quantum yield of secondary electrons in the photoresist layer. For example, since the mean free path of secondary electrons is roughly 10-20 nm, a 10-20 nm intervening layer of SOC will greatly reduce the proportion of secondary electrons that travel into the photoresist. An improved method and system for patterning $SnO_2$ using EUV lithography is therefore contemplated here.

FIG. 1 shows a conceptual diagram of a stack 101 being exposed to EUV radiation 104 in a EUV lithography system 100, according to one embodiment. The EUV light source 102 emits EUV radiation 104 at between about 10 nm and about 124 nm that may be generated from a laser-driven plasma light source. In some embodiments, the wavelength is contemplated to be about 13.5 nm. The mask 106 allows only the EUV radiation 104 that is designed to be patterned to reach the stack 101. It is noted that EUV lithography system 100 may have many different configurations and additional components not shown to avoid obfuscating the concepts set forth by FIG. 1. For example, the EUV lithography system may include a number of optical components, such as collectors, mirrors, projection optics, illuminators, etc. Additionally, the configuration of the mask 106 may be a reticle or a reflective mask in place of the mask 106 shown in FIG. 1.

The stack 101 is shown to include a photoresist 108 that is adhered to an adhesive 110 layer such as spin-on-carbon (SOC), which adheres to a layer of $SnO_2$ 112 that is desired to be patterned. One or more layers may be included in the stack between the $SnO_2$ layer 112 and the substrate 114, which may be a silicon wafer. The adhesive 110 layer is shown to be between about 1 nm to about 10 nm.

A number of representative EUV photon absorption events are shown in FIG. 1. For instance, in absorption event 116, an EUV photon may be absorbed by a photoresist molecule and cause ionization of the photoresist molecule. The absorption and ionization event generates a photoelectron having less energy than the EUV photon, which propagates from the ionized photoresist molecule to generate several secondary electrons. These secondary electrons interact with photoacid generators to generate acid (e.g., $H^+$). For each acid generation event, the secondary electron loses some energy. In some estimates, the secondary electron loses about 2-4 eV per acid generation event.

In another absorption event 118, an SOC molecule of the adhesive 110 layer absorbs an EUV without generating a photoelectron. When photoelectrons are generated by the photoelectric effect, an incident photon must transfer more energy than the work function (e.g., the electron binding energy) of the material in order to eject an electron within the material. If the incident photon energy is too low, the electron does not escape the material and no photoelectron is generated. As compared to $SnO_2$, SOC molecules are seen to have higher electron binding energies and are therefore poorer emitters of photoelectrons from EUV irradiation. Much of the incident photons are absorbed by the SOC without generating photoelectrons. The quantum yield of secondary electrons is reduced to an extent that EUV doses (e.g., EUV intensity, or duration of exposure) must be increased by a factor of about 2 to about 10 or more to yield enough photoelectrons and secondary electrons for photoacid generation and pattern transfer.

In another absorption event 120, a EUV photon is absorbed by an $SnO_2$ molecule of the $SnO_2$ layer 112, generating a photoelectron and several secondary electrons. The secondary electrons are shown to scatter in a random fashion due to scattering effects of secondary electrons in solid materials. The scattering events (e.g., deflections, forks in the secondary electron path) are due to atomic interactions of the secondary electrons with atoms in the $SnO_2$ layer. Some of these include elastic scattering, ionization, and plasmon or molecular exciton generation. In any case, the mean free path of a secondary electron may be between about 10 nm and 20 nm, which is shown by circumference 122 for reference. The presence of a 1 nm to 10 nm intervening layer of adhesive 110 therefore reduces the proportion of secondary electrons that can travel into the photoresist 108 for acid generation. As a result, quantum yield of secondary electrons is reduced by the adhesive 110 and greater doses or exposure times are required to achieve the amount of photoacid generation required for pattern transfer in the photoresist 108.

Also shown in FIG. 1 is a cartoon graph 124 that shows a representative curve 126 for the rate of photoacid generation as a function of distance for the stack 101 configuration. Ideally, photoacid would be generated within the space between the pattern edges and not outside of the pattern edges, as shown by curve 128. In some instances, generation of photoacid in the photoresist 108 outside of the desired pattern edges leads to defects, loss of contrast, loss of resolution, line edge roughness (LER), line width variation (LWV), loss of critical dimensions, and pattern collapse, among other deviations in feature edges. In some circumstances, the scattering effect of secondary electrons may contribute to the deviations in the pattern edges. It is therefore contemplated that the embodiments described here (see FIG. 3) are enabled to reduce the deviations in pattern edges (e.g., LER and LWV) after pattern transfer to the $SnO_2$ layer 112 as compared to the stack 101 shown in FIG. 1. Moreover, the embodiments contemplated here also enable a reduction in the EUV dose (e.g., reduce EUV light intensity and/or exposure time) required for printing features onto the $SnO_2$ layer 112 as compared to the stack 101 shown in FIG. 1.

Figure 2:
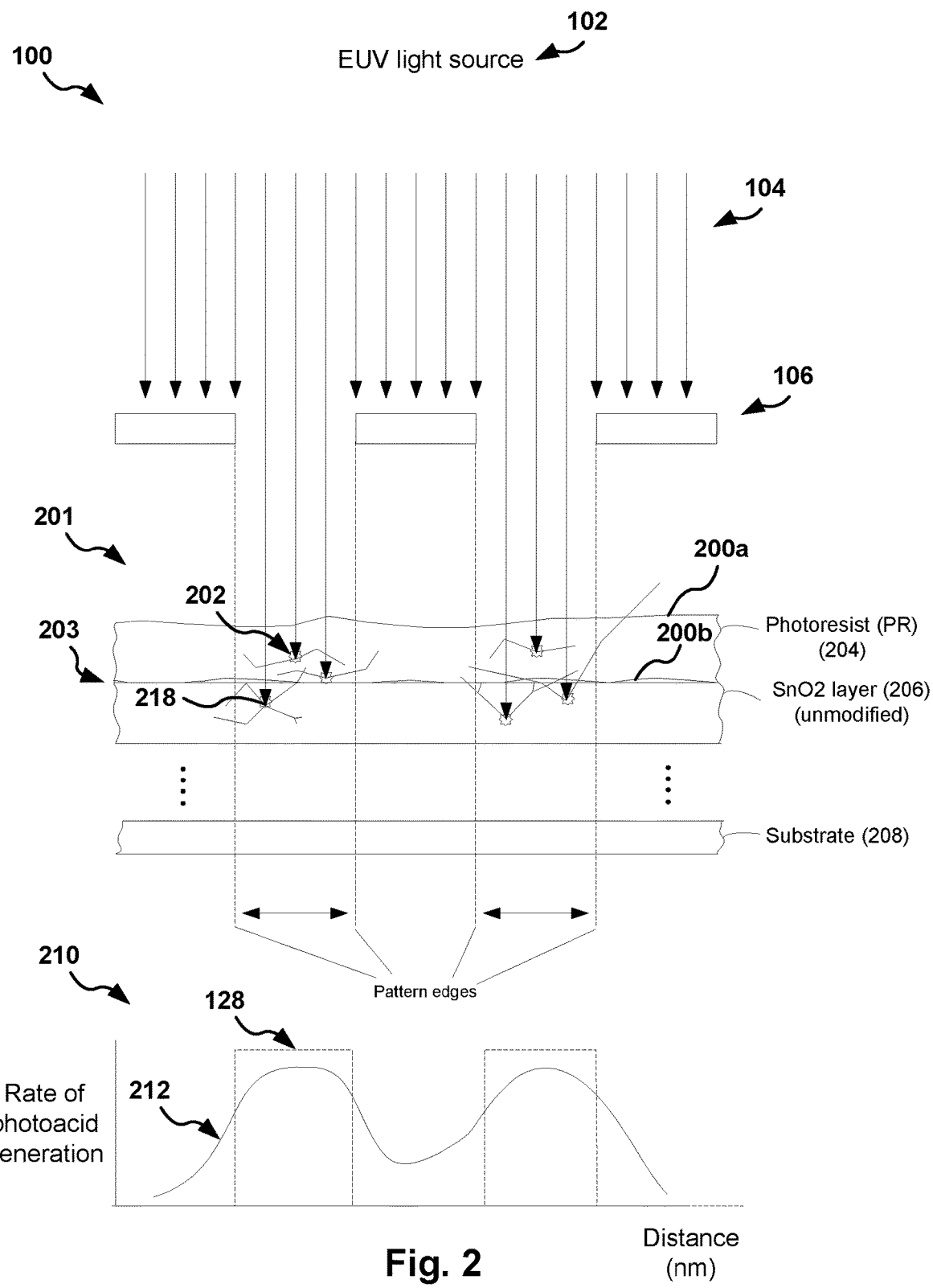
FIG. 2 shows a conceptual illustration of a stack being exposed to EUV radiation through a mask or reticle in a EUV lithography system, wherein the photoresist is applied directly to an unmodified $SnO_2$ layer, according to one embodiment.

FIG. 2 shows a conceptual illustration of a stack 201 being exposed to EUV radiation 104 through a mask 106 or reticle in a EUV lithography system 100, according to one embodiment. The stack 201 is one in which photoresist 204 is applied directly to the $SnO_2$ layer 206, both of which are on top of substrate 208 with one or more layers in between. Because photoresist 204 tends to contain polymeric organic matter, it is relatively hydrophobic (e.g., having a WCA of about 90° or above). On the other hand, the $SnO_2$ layer 206 is tends to be relatively hydrophilic, having a WCA of about 1° to about 20°. As a result, the photoresist 204 adheres poorly to the $SnO_2$ layer 206 when applied. For example, there may be nonuniformities in the thickness of the photoresist 204, beading up of the photoresist 204 in some regions, pockets of noncontact at the interface 203 between the photoresist 204 and the $SnO_2$ layer 206, and other deviations. These deviations are proposed to be the cause of pattern collapse when the photoresist 204 is developed and the $SnO_2$ layer 206 is etched (see FIG. 7A for an image of pattern collapse from applying photoresist directly onto an unmodified $SnO_2$ layer.)

Some of these deviations shown in the upper surface 200a of the photoresist 204 and the lower surface 200b of the photoresist 204. For example, the upper surface 200a is not be substantially planar. The same is true of the lower surface 200b. Some of these deviations are postulated to be formed due to the thermodynamically unfavorable molecular interactions between the hydrophobic photoresist 204 and the hydrophilic SnO₂ layer 206. When the photoresist 204 is subject to a soft bake or a hard bake, these deviations or deformities remain and may be exacerbated. In one example, small pockets of noncontact may form at the interface 203 between the photoresist 204 and the SnO₂ layer 206 when the photoresist 204 is subject to heat during a soft or hard bake. As a result, the photoresist 204 may be irregular in shape, thickness, and continuity of contact with the SnO₂ layer 206.

Additionally, it is contemplated that deviations are also formed because of lower spin rates used when spin coating photoresist 204 onto the SnO₂ layer 206. Lower spin rates are used to ensure that the photoresist 204 is not shed from the SnO₂ layer 206 from centrifugal forces. However, lower spin rates are also less effective at coating the photoresist 204 uniformly across the SnO₂ layer 206.

An absorption event 202 is shown to occur similar to absorption event 116 in FIG. 1. In another absorption event 218, an EUV photon is absorbed by an SnO₂ molecule, emitting a photoelectron and several secondary electrons. It is proposed that deviations in the photoresist 204 affect secondary electron harvesting into the photoresist 204 in a way that causes subsequent pattern collapse during pattern transfer to the SnO₂ layer 206. Several mechanisms are proposed to cause the observed pattern collapse (see FIG. 7A). In one mechanism, irregularities in the thickness of the photoresist 204 is postulated affect the dose of EUV radiation that reaches the SnO₂ layer 206. As a result, secondary electron emission from the SnO₂ 206 will be systemically irregular across the SnO₂ layer 206, which will contribute to pattern collapse.

In another mechanism contemplated to contribute to pattern collapse, the pockets of noncontact may affect secondary electron transmission between the SnO₂ layer 206 and the photoresist 204 adversely and non-uniformly. When secondary electrons are ejected with certain energies, they possess wave-like properties. As a wave, the secondary electrons have wavelengths described by the de Broglie equation:

$$\lambda = \frac{h}{p} = \frac{h}{m_e v} \quad (1)$$

In equation (1), h is Planck's constant, p is the momentum of the secondary electron, which is alternatively expressed $m_e*v$, where $m_e$ is the mass of an electron and v is its velocity.

It is well understood in the art that electrons, for example, from an electron beam, may experience diffraction and refraction, similar to photons. Secondary electrons generated as a result an EUV photon absorption event are no different. For example, secondary electrons may be subject to refraction when they traverse the interface 203, which increases scattering and decreases sensitivity, specificity, and contrast. In one postulated example, secondary electrons may experience total internal reflection (TIR) when they are incident on the interface 203 from the SnO₂ layer 206 when there are pockets of non-contact due to the difference in the refractive index of the SnO₂ and that of vacuum-like space of the pockets of noncontact. Likewise, hydrophobic-hydrophilic contact between at the interface 203 may promote refraction of secondary electrons more so than a hydrophobic-hydrophobic contact would. In any case, what is observed is increased secondary electron scattering resulting in decreased resolution, contrast, and ultimately pattern collapse when photoresist 204 is applied directly onto unmodified SnO₂ layers 206.

Also shown in FIG. 2 is a cartoon graph 210 of photoacid generation rate as a function of distance with an ideal curve 128 and an example curve 212. As compared to curve 126 of stack 101 with an intervening adhesive 110, curve 212 for stack 201 depicts higher rates of photoacid generation in the target area (e.g., inside the patter edges). However, curve 212 also demonstrates high rates of photoacid generation in non-target areas (e.g., outside of the edge patterns). The higher rate of photoacid generation in non-target areas is contemplated to be caused by the mechanisms postulated above, non-planarity of the top surface 200a and bottom surface 200b of the photoresist 204, the presence of pockets of non-contact at the interface 203, the presence of hydrophobic-hydrophilic interactions at the interface 203, beading up of photoresist (not shown), and other irregularities in the shape, thickness, topology, and proximity of the photoresist 204 in relation to the SnO₂ layer 206. As discussed above, these irregularities may result in increased scattering of secondary electrons traversing the interface 203. Because there is photoacid generation in non-target areas, these non-target areas may be made soluble in developer and result in pattern collapse.

Figure 3:
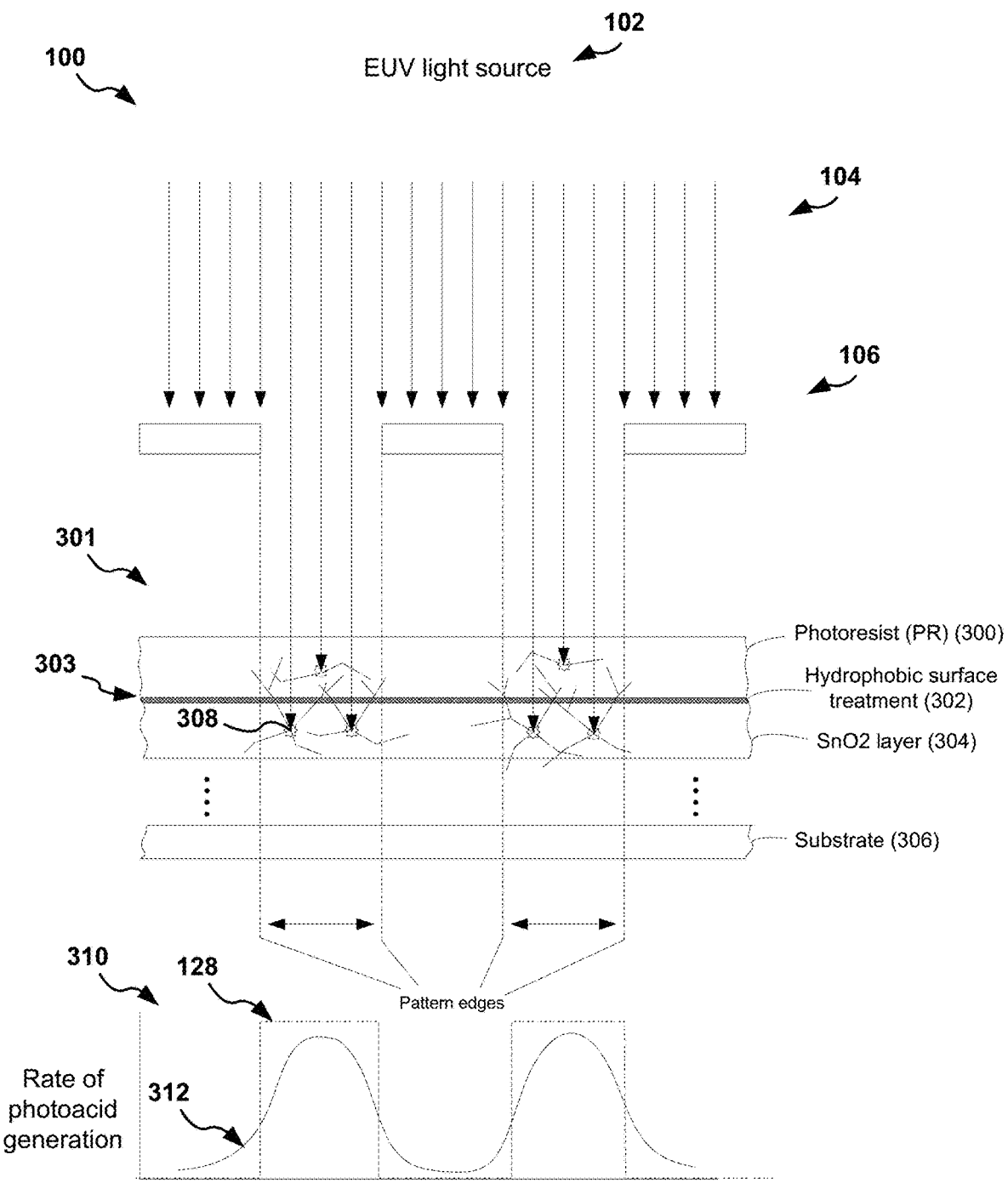
FIG. 3 shows a conceptual illustration of a stack being exposed to EUV radiation through a mask or reticle in a EUV lithography system, wherein the photoresist is applied directly to the $SnO_2$ layer that has been modified with a hydrophobic surface treatment, according to one embodiment.

FIG. 3 shows a conceptual illustration of a stack 301 being exposed to EUV radiation 104 through a mask 106 or reticle in a EUV lithography system 100, according to one embodiment. The stack 301 includes a photoresist 300 that has been applied to a hydrophobic surface treatment 302 of the upper surface of the SnO₂ layer 304. The hydrophobic surface treatment 302 is contemplated to be a monolayer of one or more compounds that modifies the hydrophilic SnO₂ layer 304 to be less hydrophilic such that the photoresist 300 adheres to the SnO₂ layer 304 without forming the irregularities shown in FIG. 2. The thickness of the hydrophobic surface treatment 302 is not drawn to scale.

In some embodiments, the hydrophobic monolayer is formed by exposing the SnO₂ layer 304 to an amino-silane or an amino-tin gaseous compound. Some exemplary amino-silane and amino-tin compounds are described in greater detail below. The amino-silane or amino-tin gaseous compound reacts with SnO₂ molecules exposed by the upper surface of the SnO₂ layer 304 and self-assembles into a monolayer. In other embodiments, the amino-silane or amino-tin compound may be in liquid form for reaction. Additionally, in other embodiments, more than one layer of the hydrophobic compound may be used for the hydrophobic surface treatment 302.

In some embodiments, the WCA of the SnO2 layer 304 is increased by between about 5° or lower to about 100° or more, or between about 10° and about 80°, or between about 20° and about 50°. For example, if the SnO₂ layer 304 has a WCA of between about 1°-20°, it is contemplated that the hydrophobic surface treatment 302 is to increase the WCA of the SnO₂ layer 304 to between about 30° and about 120° or above.

When the photoresist 300 is applied to the SnO₂ layer 304 with the hydrophobic treatment 302, adhesion of the photoresist 300 to the SnO₂ layer 304 is improved. The improved adhesion results in greater contact uniformity at the interface 303 between the photoresist 300 and the SnO₂ layer 304, a greater level of planarity of the photoresist 300, and a greater uniformity in thickness of the photoresist 300. It is postulated that the hydrophobic-hydrophobic interactions at the interface 303 increases stability of the contact of the photoresist 300 and $SnO_2$ layer 304 due to more thermodynamically favorable interactions as compared to hydrophobic-hydrophilic interactions (e.g., both pre-bake and post-bake).

The increased contact stability is contemplated to result in more uniform and continuous contact between the photoresist 300 and the $SnO_2$ layer 304. Additionally, the increased adhesion is contemplated to reduce or eliminate pockets of noncontact that contribute to additional scattering of secondary electrons. As a result, the quantum yield of secondary electrons is improved as compared to stack 101 with an intervening adhesive 110, while also improving the specificity of secondary electron harvesting as compared to stack 201 without hydrophobic surface treatment 302. The improved specificity of secondary electron harvesting results in pattern transfer without pattern collapse, as shown in FIG. 7B.

In absorption event 308, an $SnO_2$ molecule absorbs the energy of an EUV photon and ejects a primary electron (e.g., photoelectron) that produces several secondary electrons. When the secondary electrons traverse the interface 303, they may be subject to less refraction than those traversing interface 203. Additionally, total internal reflection is less of a factor because interface 303 demonstrates more continuous contact. As a result, there is less of a scattering effect of the secondary electrons that enter the photoresist 300. Further, since the thickness of the photoresist 300 may be made more consistent because of the hydrophobic surface treatment 302, there is also an improved uniformity in the rate of EUV photon absorption events occurring across a given exposed area.

Also shown in FIG. 3 is a cartoon graph 310 of photoacid generation rate as a function of distance with an ideal curve 128 and an example curve 312. As compared to curve 126 of stack 101 with an intervening adhesive 110, curve 312 for stack 301 depicts higher rates of photoacid generation in the target area (e.g., inside the pattern edges). As compared to curve 212 of stack 201 with no hydrophobic surface modification 302, curve 312 depicts lower rates of photoacid generation in non-target areas (e.g., outside of the edge patterns). As a result, more spatial specificity in photoacid generation may be achieved with the hydrophobic surface treatment 302 and pattern transfer may occur without pattern collapse. In addition to avoiding pattern collapse, the hydrophobic surface treatment 302 enables lower EUV doses and/or less exposure times for printing features onto the photoresist than that needed for stacks with an intervening adhesive such as SOC.

Figure 4A:
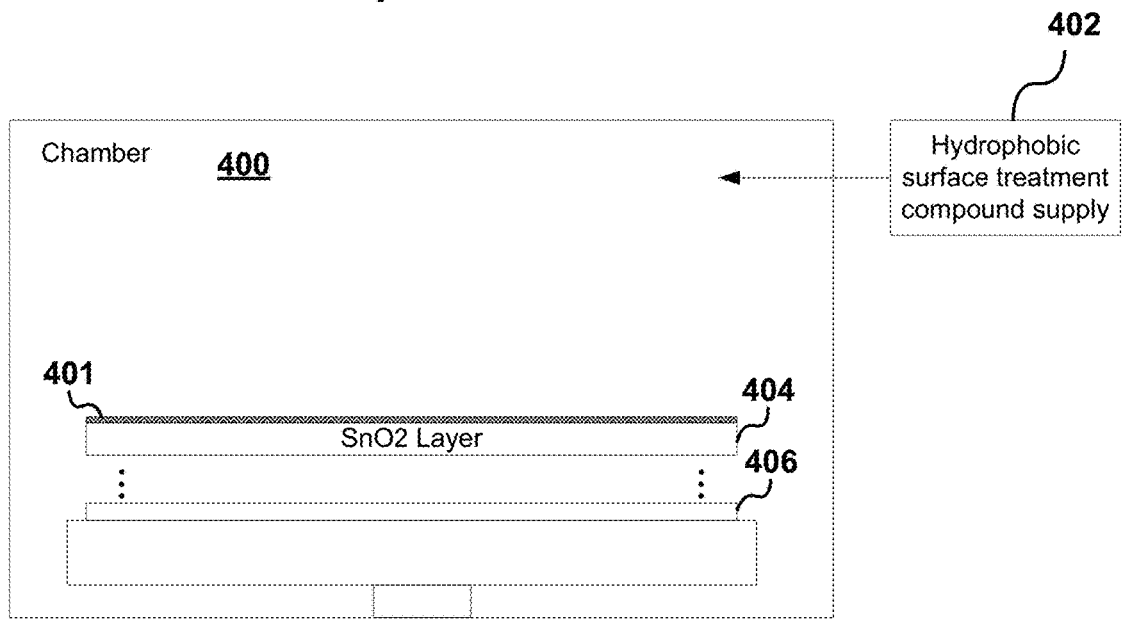
FIG. 4A shows a conceptual diagram of a chamber used for applying a hydrophobic surface treatment to an $SnO_2$ layer residing on a substrate, according to one embodiment.

FIG. 4A shows a conceptual diagram of a chamber 400 used for applying a hydrophobic surface treatment 401 to an $SnO_2$ layer 404 residing on a substrate 406, according to one embodiment. A hydrophobic surface treatment compound supply 402 supplies the compound into the chamber for reaction with the upper surface of the $SnO_2$ layer 404. Many compounds are contemplated to be used for the hydrophobic surface treatment 401. In some embodiments, an amino-organometalloid/amino-organometal may be used, including amino-silane or an amino-tin compounds. Some of these are described by the following chemical structures:

$$R_3-Si-N-R_2 \quad (2)$$

$$R_2-Si-(N-R_2)_2 \quad (3)$$

$$R_3-Sn-N-R_2 \quad (4)$$

$$R_2-Sn-(N-R_2)_2 \quad (5)$$

In (2)-(5), R is an alkyl group. For example, in some embodiments, the hydrophobic surface treatment compound may include alkyl-silanes and alkyl-tin compounds such as $(CH_3)_2Si[N(CH_3)_2]_2$, $(CH_3)_3SiN(CH3)_2$, $(CH_3)_2Sn[N(CH_3)_2]_2$, or $(CH_3)_3SnN(CH_3)_2$, or a combination of the aforementioned. Additionally, HMDS (hexamethyldisilazane, $HN[Si(CH_3)_3]_2$) is also contemplated to be used to transfer trimethylsilyl (TMS) groups to $SnO_2$ surfaces. The abovementioned hydrophobic surface treatment compounds are provided as non-limiting exemplary compounds that react with $SnO_2$ surfaces to increase hydrophobicity of those surfaces such that adhesion of photoresist is increased. One skilled in the art will recognize that there may be other hydrophobic surface treatment compounds that, due to their ability to react with $SnO_2$ surfaces and make those surfaces more hydrophobic for photoresist adhesions, also fall within the scope and spirit of the present disclosure. Additional non-limiting examples are provided below.

It is noted that for alkyl-silanes and alkyl-tins, the presence of $H_2O$ may be used for the reaction with $SnO_2$ surface to proceed. Sometimes, intrinsic moisture from the substrate will provide sufficient $H_2O$ for reaction of alkyl-silanes/tins to occur. In other embodiments, water vapor may be provided to the processing chamber 400 for hydrolysis and transfer of the TMS or trimethyl-tin groups to the $SnO_2$ surface.

In still other embodiments, various compounds having silane or tin atom with a reactive group (e.g., alkoxyl group) coupled to an amino group with a carbon chain having 1 to 20 or more carbon atoms are also contemplated to modify the surface of the $SnO_2$ layer 404 to be more hydrophobic. For example, the composition of the hydrophobic surface treatment compound supplied by the supply 402 may be described by the following structures:

$$R-(CH_2)_n-Si-X_3 \quad (6)$$

$$R-(CH_2)_n-Sn-X_3 \quad (7)$$

Broadly, the hydrophobic surface treatment compound is contemplated to by any compound that reacts (e.g., via hydrolysis or otherwise) with $SnO_2$ to form a covalent bond with a Sn atom while also containing non-polar groups to promote increased hydrophobicity of the $SnO_2$ surface. It will be understood to those skilled in the art that there are numerous additional chemical compositions, isomers, enantiomers, etc. that fall within the scope and spirit of the present disclosure but that are not presented to not unnecessarily obscure the concepts behind the present disclosure.

In both of (6) and (7), R is an organofunctional group that is generally non-hydrolysable from the carbon chain. In some embodiments, R is $NH_2$, $NH_3^+$, $CH_3$, $NHCH_3$, $N(CH_3)_2$, $N(C_2H_5)_2$, $N(C_3H_7)_2$, etc. Also, in both of (6) and (7), n is a number between 1 and 30, or between 2 and 20, or between 3 and 5. Longer alkyl chains (e.g., n>10) tend to promote greater hydrophobicity in the surface of the $SnO_2$ layer 404. However, longer alkyl chains also introduce uncertainties in the hydrophobic surface treatment process. It is more challenging to produce or source amino-organometalloids with consistent number of carbons for longer alkyl groups than it is for those with shorter alkyl chains. And since it is one objective of the present embodiments to introduce greater uniformity in the hydrophobic surface treatment, it may be more difficult to do so with longer chain alkyl groups.

Further, amino-organometalloids or amino-organometals (herein referred to as amino-organometalloids) with longer alkyl groups may also slow down the treatment process by lowering the rate of reaction with the $SnO_2$ molecules of the $SnO_2$ layer 404 and may also lower the uniformity of coverage of the $SnO_2$ layer 404 with the hydrophobic surface treatment compound. It is therefore contemplated that alkyl groups having between 2 and 10 carbons may provide the level of enhanced hydrophobicity while also enhancing reaction rates and uniformity of coverage.

Referring still to (6) and (7), $X_3$ is contemplated to include between one to three hydrolysable groups (e.g., an alkyloxy group). For example, in one embodiment, $X_3$ may have $X_a$=OH, COOH, or $OCH_3$, etc., while $X_{b,c}$=H, $CH_3$, $C_2H_5$, $C_3H_5$. In another embodiment, $X_3$ may have $X_{a,b,c}$=OH, COOH, $OCH_3$, $OC_2H_5$, etc. In some embodiments, dipodal or tripodal silane groups may be used, the composition of which is described as follows:

R—CH—[(CH2)$_n$M-X$_3$]$_2$ (8)

R—C—((CH$_2$)$_n$M-X$_3$)$_3$ (9)

In (8) and (9) M is a metalloid/metal such as Si or Sn. The compound shown in (8) can bond with up to 6 Sn atoms while the compound in (9) can bond with up to 9.

In some embodiments, the hydrophobic surface treatment compound may form a monolayer across the surface of the $SnO_2$ layer 404. Such a contemplated monolayer has a thickness of one molecule of the treatment compound (e.g., between about 5 Å to about 100 Å). In some embodiments, the treatment compound may form "self-assembled monolayers." A self-assembled monolayer is a one molecule thick layer of the material (here, the hydrophobic treatment compound) as a result of chemical forces during deposition and reaction. Further, in some embodiments having more than one hydrolysable group (e.g., three $OCH_3$ groups), each treatment compound molecule may form more than one oxane bond with the $SnO_2$ layer 404 as well as siloxane bonds among one another.

Figure 6C:
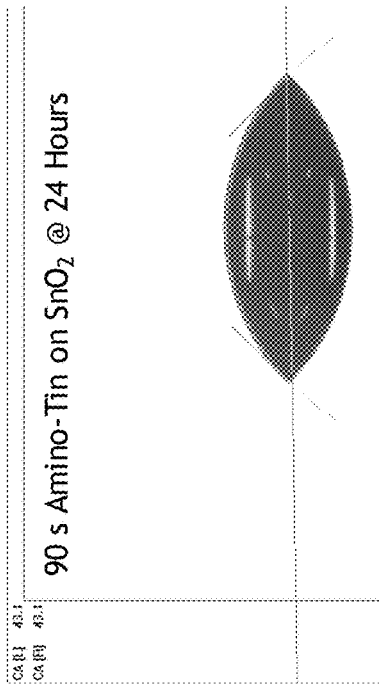
FIG. 6A-6D show empirical results of amino-silane and amino-tin treatment on $SnO_2$ surfaces, according to certain embodiments.

The hydrophobic surface treatment compound is contemplated to be in a vapor phase and exposed to the $SnO_2$ layer 404 in chamber 400 for between about 5 seconds or less to about 180 seconds or more, or between about 10 seconds to about 60 seconds, or between 15 seconds and 30 seconds. Some of the experimental results with respect to treatment exposure times for amino-silane and amino-tin are shown in FIGS. 6A and 6C, respectively. Exposure times will vary depending upon the hydrophobic surface treatment compound used, where more chemically complex (e.g., longer alkyl chains, branched chains, number of alkoxy groups) compounds may require relatively higher exposure times to achieve a similar percentage of coverage or increase in hydrophobicity.

In some embodiments, the flow of the hydrophobic surface treatment compound into the chamber 400 will be between about 5 standard cubic centimeters per minute (SCCMs) and about 1000 SCCMS, or about 10 SCCMs to about 100 SCCMs, or between about 20 SCCMs and about 40 SCCMs. In some embodiments, a carrier gas such as helium is flown into the chamber 400 at between about 20 SCCMs and about 200 SCCMS or higher, or between about 50 SCCMs to about 100 SCCMs. In some embodiments, the chamber 400 includes one or more heating and/or cooling elements (not shown) to maintain a temperature of between about room temperature to about 100° C. or between about 30° C. to about 60° C., or at about 50° C.

Further, in some embodiments, it is contemplated that the hydrophobic surface treatment 401 is to have about 10% to about 100% of coverage on the $SnO_2$ layer 404, where coverage is described as the number of Sn atoms bonded to a hydrophobic surface treatment compound divided by the total number of Sn atoms that can participate in such bonds under the conditions provided above. In other embodiments, coverage of between about 20% to about 99.99%, or between about 50% to about 99%, or between about 70% to 90% are contemplated to be achieved with the process shown in FIG. 4A. These ranges are envisioned to increase hydrophobicity of the surface of the $SnO_2$ layer 404 such that photoresist adhesion is increased to improve pattern transfer in terms of improving line edge roughness, line width variation/roughness, and avoiding pattern collapse as compared to applying photoresist to untreated $SnO_2$ layers.

In some embodiments, the hydrophobic surface treatment 401 is seen to increase the WCA of the $SnO_2$ layer 404 by between about 5° to about 100°, or between about 10° to about 80°, or between about 20° and about 50°. These increases in WCA are contemplated to increase adhesion of photoresist to the $SnO_2$ layer 404 to result in improvements in LER, LWV, and avoiding pattern collapse as compared to applying photoresist to untreated $SnO_2$ layers.

Figure 4B:
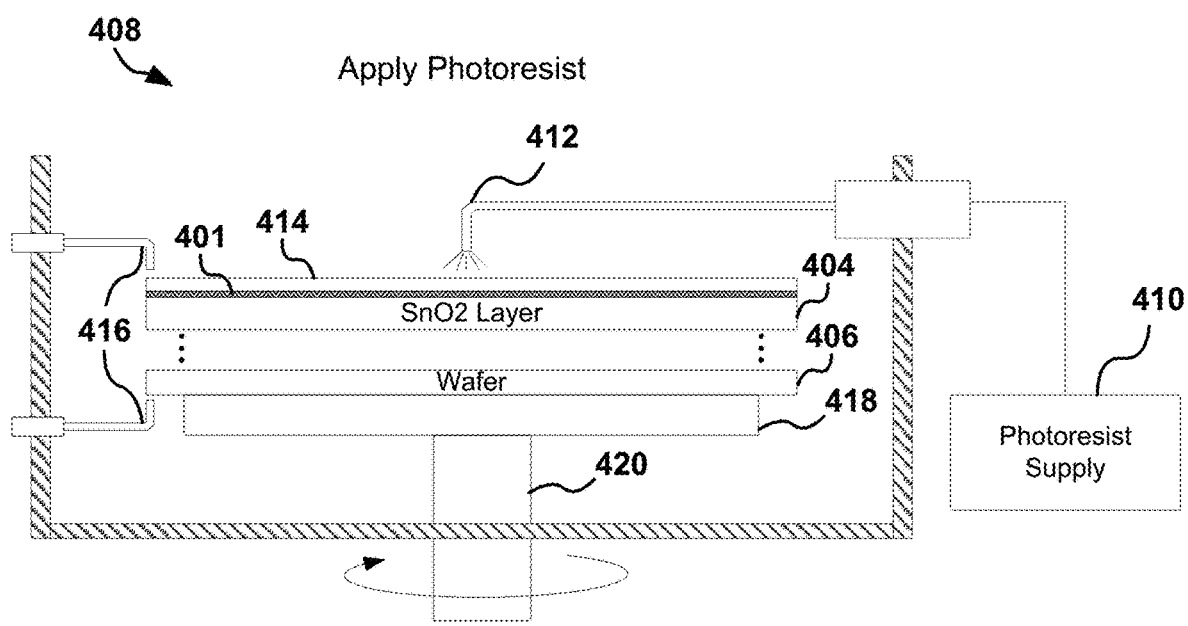
FIG. 4B shows a conceptual diagram of a photoresist spin coater that is in the process of applying a layer of photoresist onto the $SnO_2$ layer having the hydrophobic surface treatment, according to one embodiment.

FIG. 4B shows a conceptual diagram of a photoresist spin coater 408 that is in the process of applying a layer of photoresist 414 onto the $SnO_2$ layer 404 with the hydrophobic surface treatment 401, according to one embodiment. The photoresist 414 is supplied by a photoresist supply 410 and is applied onto the $SnO_2$ layer 404 via dispenser 412. The wafer 406 is then spun via a spindle 420 connected to chuck 418 to distribute the photoresist 414 evenly and to shed excess photoresist for suction by one or more edge bead removers (EBR) 416.

Typically, high spin rates are used (e.g., 3000-8000 rpm) to distribute the photoresist evenly on the substrate, depending upon the viscosity of the photoresist. When photoresist is applied to $SnO_2$ layers that are unmodified by a hydrophobic surface treatment compound, lower spin rates must be used to avoid centrifugal shedding of large portions of the applied photoresist due to the poor adherence. The resulting photoresist layer is seen to have irregularities such as non-uniform thickness, beading up, pockets of noncontact, etc. The hydrophobic surface treatment 401 enables the photoresist 414 to adhere to the $SnO_2$ layer 404 such that higher spin rates may be used with lower levels of centrifugal shedding as compared to untreated $SnO_2$ layers. The resulting photoresist 414 is seen to have greater uniformity in thickness, topology, and contact with the $SnO_2$ layer 404.

Figure 5A:
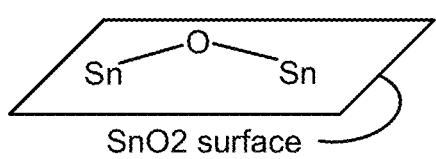
FIGS. 5A-5H show how the $SnO_2$ surface is modified by hydrophobic surface treatment compounds, according to certain embodiments.
Figure 5B:
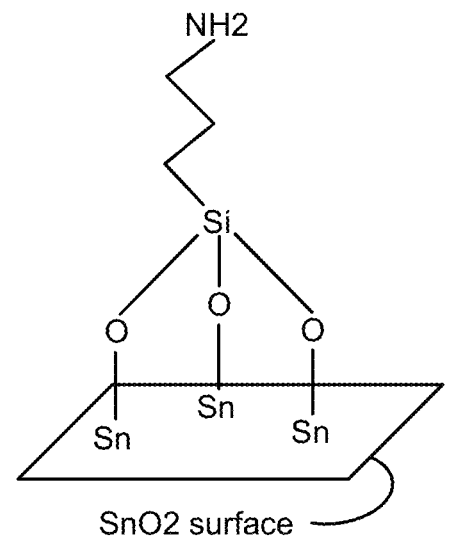
Figure 5C:
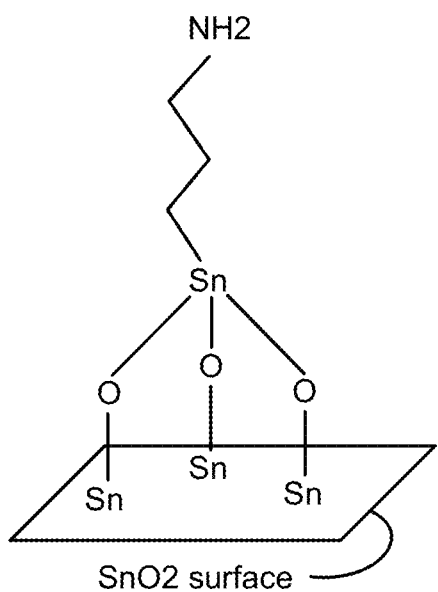
Figure 5D:
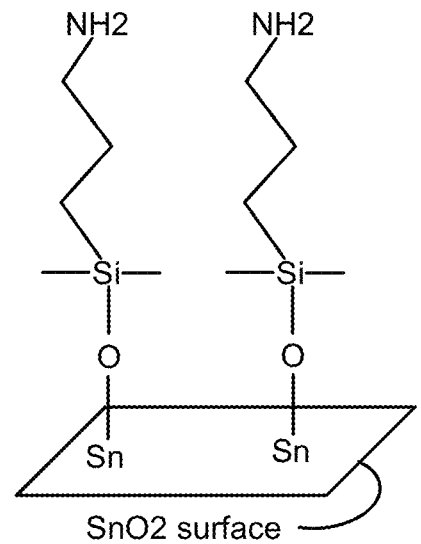

FIGS. 5A-5H show how the $SnO_2$ surface is modified by hydrophobic surface treatment compounds, according to certain embodiments. FIG. 5A shows an oxygen atom bonded to two Sn atoms at the surface of an $SnO_2$ layer. In other embodiments, the Sn atoms may be hydroxylated in a priming step. In FIG. 5B, an exemplary amino-silane precursor (e.g., $(OCH_3)_3Si(CH_2)_3NH_2$) is shown to have reacted with three Sn atoms via oxane bonds. In FIG. 5C, an exemplary amino-tin precursor (e.g., $(OCH_3)_3Sn(CH_2)_3NH_2$) is shown to have reacted with three Sn atoms. FIG. 5D shows two exemplary amino-silane precursors (e.g., $OCH_3Si(CH_2)_3NH_2(CH_3)_2$) reacting with a Sn atom each. The macro effect of such reactions increases the hydrophobicity of the $SnO_2$ surface and the adhesion of photoresist thereto.

Figure 5E:
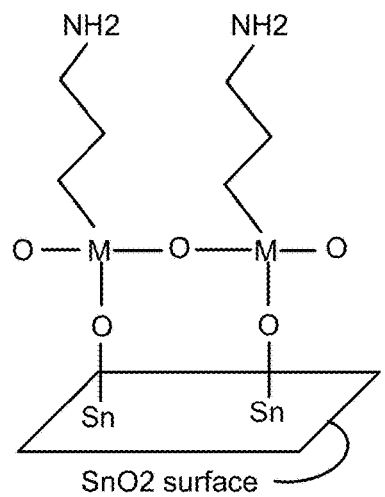
Figure 5F:
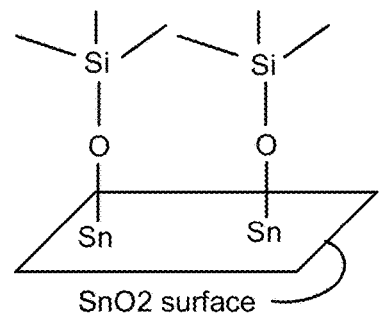

FIG. 5E shows an embodiment of a $SnO_2$ surface treated with an amino-metalloid-silane precursor having three alkoxyl group where M is a metalloid or metal such as Si or Sn. One of the three alkoxy group reacts with a Sn atom while the other two bond with neighboring M atom. FIG. 5F shows an embodiment of an $SnO_2$ surface treated with hexamethyldisilazane (HMDS), or $(CH_3)_2Si[N(CH_3)_2]_2$, $(CH_3)_3SiN(CH_3)_2$. The result of such a treatment is the transfer of trimethylsilyl groups to Sn atoms of the $SnO_2$ surface. A similar reaction with the following tin-containing hydrophobic surface treatment compounds is also possible to modify the $SnO_2$ with trimethyl-tin groups: $(CH_3)_2Sn(N(CH_3)_2)_2$, $(CH_3)_3SiN(CH_3)_2)$, and $HN[Sn(CH_3)_3]_2$.

Figure 5G:
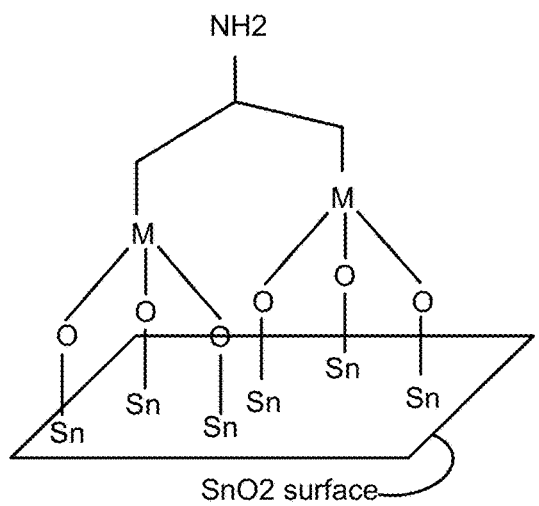
Figure 5H:
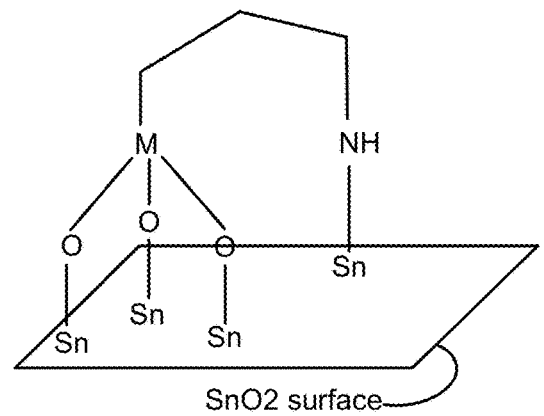

FIG. 5G shows an embodiment of an $SnO_2$ surface treated with a dipodal silane group where M is a metalloid/metal such as Si or Sn. FIG. 5H shows an embodiment of an amino-organometalloid having formed bonds with Sn atoms of the $SnO_2$ surface via a metalloid/metal M atom and via an amino group.

FIG. 6A-6D show empirical results of amino-silane and amino-tin treatment on $SnO_2$ surfaces, where the amino-silane or amino-tin is introduced as a vapor at between 10-50 SCCMs into a chamber maintained at between 30° C. and 60° C., according to certain embodiments. FIG. 6A shows how WCA of an $SnO_2$ surface varies as a function of time of treatment as well as time after treatment (e.g., queue time). With no treatment of amino-silane, the WCA is slightly less than 20°, indicating that the $SnO_2$ surface is quite hydrophilic. The WCA of nontreated $SnO_2$ stays within a few degrees of 20° over a period of 48 hours. Treatment of the $SnO_2$ surface with amino-silane for 30 seconds results in a WCA of roughly 57° at 0 hours of queue time. The WCA is reduced by about 2° over the span of 48 hours, indicating that hydrophobic surface treatments are relatively stable.

When the $SnO_2$ surface is treated with amino-silane for 90 seconds or 180 seconds, it is found that the WCA of the surface does not increase. Instead, there is a slight decrease in the WCA for both 90 and 180 seconds of treatment as compared to 30 seconds of treatment. Further, it is found that the WCA of surfaces treated with amino-silane for 90 seconds or 180 seconds tend to decrease over a span of 48 hours of queue time, with the surface treated for 180 seconds decreasing at a greater rate.

Figure 6D:
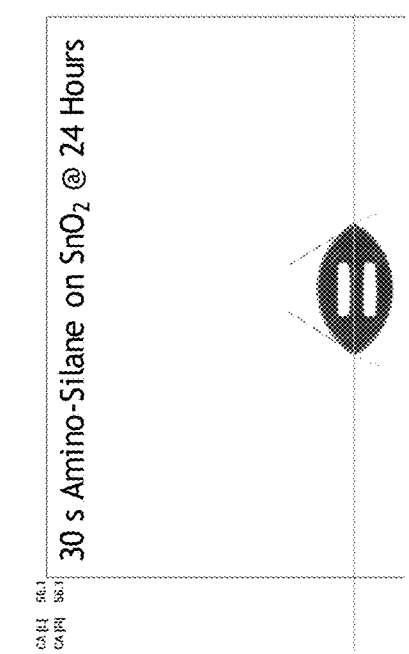
Figure 6A:
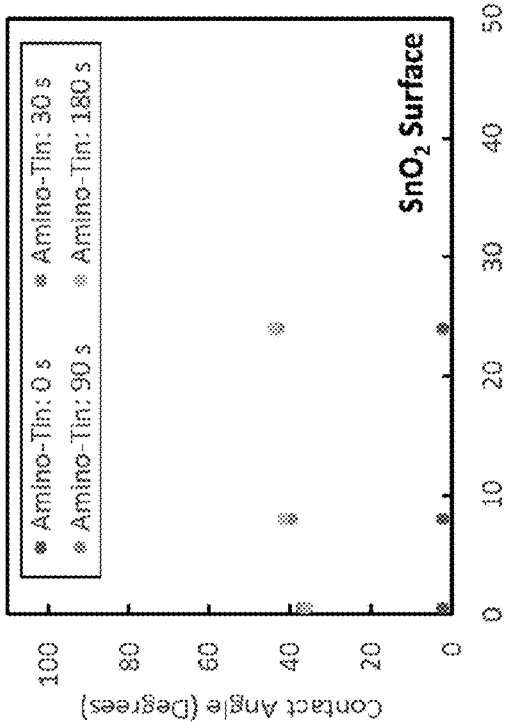
Figure 6B:
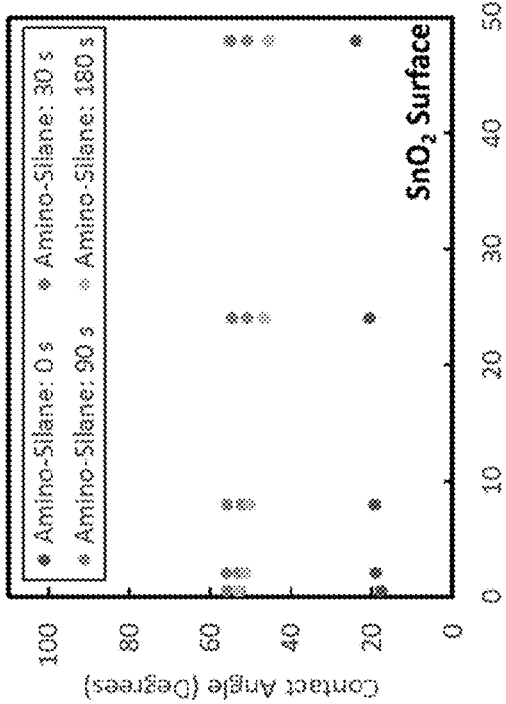

FIG. 6B shows a water droplet and corresponding water contact angles on a $SnO_2$ surface modified by amino-silane treatment for 30 seconds at 24 hours after treatment. FIG. 6B demonstrates that the $SnO_2$ surface is made more hydrophobic and less hydrophilic. Even though the surface may not be considered "hydrophobic" by common definitions in the art (e.g., where hydrophobic means WCA>90°), the surface is nevertheless made more hydrophobic to an extent that adhesion of photoresist is promoted.

FIG. 6C shows how the WCA of a surface changes with varying periods of amino-tin treatment and at various points after treatment. With no treatment (e.g., amino-tin: 0 s), the WCA of the experimental $SnO_2$ surface was found to be about 1-2°. After treatment with 30, 90, or 180 s with amino-tin, the surface experienced an increase in WCA of roughly 35° or more. In contrast to amino-silane treatment, it is noted in FIG. 6C that the WCA of the treated surface tends to increase slightly by about 5° over a span of 24 hours. It is also found that both amino-silane and amino-tin effectively increase hydrophobicity and WCA by roughly similar extents. While amino-silane treatment for 30 seconds results in the greatest absolute change in hydrophobicity (e.g., WCA is increased by 38°), amino-tin treatment is shown to be more consistent for different treatment times.

FIG. 6D shows a water droplet on an $SnO_2$ surface treated with amino-tin for 90 seconds at 24 hours after treatment. Again, while the surface shown in FIG. 6D may not technically be considered "hydrophobic" by common definitions in the art, it has been made more hydrophobic to an extent that photoresist adhesion increases such that pattern transfer may be performed without pattern collapse. It has been found in relation to the present description that hydrophobic surface treatments with amino-silane and amino-tin promote adhesion of photoresist on SnO2 layers for 70 days or longer after treatment.

FIGS. 7A and 7B show scanning electron microscope (SEM) images of etched $SnO_2$ layers with line patterns of roughly 18 nm pitches, according to certain embodiments. In FIG. 7A, photoresist is applied directly to unmodified $SnO_2$ for EUV lithography. The result is noticeable pattern collapse. For example, regions 700 and 702 show failed pattern transfer where a trench is not formed where it should have been. Regions 704 and 706 show trenches that are over-etched and wider than desired for the pattern. Region 708 shows substantial line edge roughness and line width variation and roughness. Region 710 shows feature distortion and shifting. Each of these regions are examples of how applying photoresist directly to $SnO_2$ having no hydrophobic surface treatment results in pattern collapse.

FIG. 7B shows patterning of $SnO_2$ using EUV lithography where the $SnO_2$ is treated with a hydrophobic surface treatment compound (e.g., amino-silane, or amino-tin) prior to direct application of the photoresist. The enhanced adhesion of the photoresist to the surface-modified $SnO_2$ enables the photoresist to be applied more uniformly and with more consistent contact with the $SnO_2$ surface. As a result, the pattern is transferred to the photoresist with greater resolution, contrast, and specificity. The enhanced pattern transfer in the photoresist carries over to enhanced pattern transfer during $SnO_2$ etching. For example, trench 712 has well defined edges with improved line edge roughness and line width variation. Further, each trench in the pattern has been transferred with no visible failed line pattern transfers. Additionally, no visible pattern distortion is seen after the transfer process in contrast to that seen in FIG. 7A. Thus, the hydrophobic surface treatment of $SnO_2$ is shown to enable direct application of photoresist to the $SnO_2$ without subsequent pattern collapse in the $SnO_2$ for pitches of about 18 nm or lower.

Computer programs for controlling delivery of hydrophobic surface treatment compounds and for photoresist application can be written in any conventional computer readable programming language: for example, assembly language, C, C++, Pascal, Fortran or others. Compiled object code or script is executed by the processor to perform the tasks identified in the program.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium.

The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing.

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method, comprising:
   introducing a hydrophobic surface treatment compound into a processing chamber, the processing chamber contains a substrate with an $SnO_2$ layer for processing, the hydrophobic surface treatment compound forms a modification to a surface of the $SnO_2$ layer that increases more a hydrophobicity of the surface; and
   depositing a photoresist layer on the surface of the $SnO_2$ layer via spin coating, said modification of the surface of the $SnO_2$ layer enhances adhesion of contact between the photoresist and the $SnO_2$ layer during spin coating;
   wherein the hydrophobic surface treatment compound includes a reactive group and an amino group, the reactive group reacts with Sn atoms of the surface of the $SnO_2$ layer for said modification and the amino group participates in hydrophobic-hydrophobic interactions with the photoresist by increasing the hydrophobicity of the surface.

2. The method of claim 1, wherein said modification enables the contact between the photoresist and the $SnO_2$ layer to be direct and continuous after said spin coating.

3. The method of claim 1, wherein said modification enables greater uniformity in thickness of the photoresist after said spin coating than when photoresist is applied to the $SnO_2$ layer without said modification.

4. The method of claim 1, wherein said modification forms a coating of the hydrophobic surface treatment compound on the surface of the $SnO_2$ layer to enable direct deposition of the photoresist onto the $SnO_2$ layer without an intervening layer between the photoresist and said coating.

5. The method of claim 1, wherein said enhanced adhesion of the contact between the photoresist and the $SnO_2$ layer is mediated by hydrophobic-hydrophobic intermolecular forces that are more thermodynamically favorable than hydrophilic-hydrophobic intermolecular forces occurring when photoresist is applied to the surface of the $SnO_2$ layer without said modification.

6. The method of claim 1, wherein when the photoresist is exposed to extreme-ultraviolet (EUV) light during lithography, said enhanced adhesion of contact between the photoresist and the $SnO_2$ layer enables a higher rate secondary electron harvesting from the $SnO_2$ layer than when there is an intervening layer between the photoresist and the $SnO_2$ layer.

7. The method of claim 1, wherein when the photoresist is exposed to EUV light during lithography for pattern transfer to the photoresist, said enhanced adhesion of contact between the photoresist and the $SnO_2$ layer enables greater resolution of the pattern transfer than when photoresist is applied to the $SnO_2$ layer without said modification.

8. The method of claim 1, wherein the hydrophobic surface treatment compound reacts with Sn atoms of the $SnO_2$ layer to form a monolayer of the hydrophobic surface treatment compound.

9. The method of claim 1, wherein the hydrophobic surface treatment compound is an amino-silane compound or an amino-tin compound.

10. The method of claim 1, wherein the hydrophobic surface treatment compound is one of $(CH_3)_2Si[N(CH_3)_2]_2$, $(CH_3)_3SiN(CH_3)_2$, $(CH_3)_2Sn[N(CH_3)_2]_2$, $(CH_3)_3SnN(CH_3)_2$, $HN[Si(CH_3)_3]_2$, or $HN[Sn(CH_3)_3]_2$.

11. The method of claim 1, wherein said introducing the hydrophobic surface treatment compound into the processing chamber is characterized by a flow rate of between 5 standard cubic centimeters per minute (SCCMs) and 100 SCCMs to provide sufficient hydrophobic surface treatment compound for said modification.

12. The method of claim 1, wherein the surface of the $SnO_2$ layer is exposed to the hydrophobic surface treatment compound in the processing chamber for between 10 seconds and 180 seconds to allow the hydrophobic surface treatment compound to react with the surface.

13. The method of claim 1, wherein said modification of the surface of the $SnO_2$ layer increases a water contact angle (WCA) of the surface by at least 10°.

14. A method, comprising:
   depositing an $SnO_x$ layer on a substrate, a surface of the $SnO_x$ layer is hydrophilic;
   reacting the surface of the $SnO_x$ layer with a hydrophobic surface treatment compound such that the surface becomes less hydrophilic; and
   spin coating a photoresist on the $SnO_x$ layer, the surface of the $SnO_x$ layer as reacted with the hydrophobic surface treatment compound to be less hydrophilic increases adhesion of the $SnO_x$ layer to the photoresist such that there is direct contact between the photoresist and the $SnO_x$ layer;
   wherein the hydrophobic surface treatment compound includes a reactive group and an amino group, the reactive group reacts with Sn atoms of the surface of the $SnO_x$ layer and the amino group participates in hydrophobic-hydrophobic interactions with the photoresist.

15. The method of claim 14, further comprising:
   transferring a pattern onto the $SnO_x$ layer using EUV lithography, wherein said direct contact between the photoresist and the $SnO_x$ layer reduces line edge roughness of features within the pattern.

16. The method of claim 14, wherein said reacting the surface of the $SnO_x$ with the hydrophobic surface treatment compound forms a self-assembling monolayer (SAM) such that there is only the monolayer of the hydrophobic surface treatment compound separating the photoresist from the $SnO_x$ layer.

17. The method of claim 14, wherein the hydrophobic surface treatment compound includes a reactive group and a hydrophobic group, the reactive group bonds with the $SnO_x$ layer and the hydrophobic group interacts with the photoresist to cause said increased adhesion of the $SnO_x$ layer to the photoresist.

18. The method of claim 14, wherein x is between 1 and 8.

19. The method of claim 14, wherein the hydrophobic surface treatment compound is one of $(CH_3)_2Si[N(CH_3)_2]_2$, $(CH_3)_3SiN(CH_3)_2$, $(CH_3)_2Sn[N(CH_3)_2]_2$, $(CH_3)_3SnN(CH_3)_2$, $HN[Si(CH3)_3]_2$, or $HN[Sn(CH_3)_3]_2$.

\* \* \* \* \*